United States Patent [19]

Bjorklund et al.

[11] 4,390,876
[45] Jun. 28, 1983

[54] ELECTRIC UTILITY DEMAND LIMITING DEVICE AND METHOD

[75] Inventors: Glenn J. Bjorklund, Santa Ana; Charles E. Phillips, Alhambra, both of Calif.

[73] Assignee: Southern California Edison Co., Inc., Rosemead, Calif.

[21] Appl. No.: 172,251

[22] Filed: Jul. 25, 1980

[51] Int. Cl.³ .................... H04Q 9/00; H02J 13/00
[52] U.S. Cl. .................... 340/825.17; 340/310 A; 307/35
[58] Field of Search .......... 340/147 R, 825.17, 310 A, 340/825.06; 364/492; 307/39, 35

[56] References Cited

U.S. PATENT DOCUMENTS

| | | | |
|---|---|---|---|
| 3,683,343 | 8/1972 | Feldman et al. | 340/310 |
| 3,789,236 | 1/1974 | Lacroix | 307/96 |
| 3,906,242 | 9/1975 | Stevenson | 307/38 |
| 4,064,485 | 12/1977 | Leyde | 340/147 R |
| 4,075,699 | 2/1978 | Schneider et al. | 364/492 |
| 4,117,537 | 9/1978 | Muench | 364/492 |
| 4,125,782 | 11/1978 | Pollnow, Jr. | 307/35 |
| 4,125,895 | 11/1978 | Buhlmann | 364/483 |
| 4,130,874 | 12/1978 | Pai | 364/514 |
| 4,135,181 | 1/1979 | Bogacki et al. | 340/310 A |
| 4,152,605 | 5/1979 | Conde et al. | 307/3 |
| 4,153,936 | 5/1979 | Schmitz et al. | 364/493 |
| 4,167,679 | 9/1979 | Leyde et al. | 307/35 |
| 4,168,491 | 9/1979 | Phillips et al. | 340/310 A |
| 4,174,064 | 11/1979 | Pratt, Jr. | 340/147 R |
| 4,180,744 | 12/1979 | Helwig, Jr. | 340/147 R |
| 4,190,800 | 2/1980 | Kelly, Jr. et al. | 325/37 |
| 4,247,786 | 1/1981 | Hedges | 340/310 A |

OTHER PUBLICATIONS

"Experiences with French Tariff Structures: Technical Means for the Implementation of Tarrif Structures," by Lorgeau and Requin, Reprinted from the Proceedings of a French-American Conference on Energy Systems, Forecasting, Pricing, and Planning at the Univ. of Wisconsin, Sep. 23 through Oct. 3, 1974.

*Primary Examiner*—Donald J. Yusko
*Attorney, Agent, or Firm*—Lyon & Lyon

[57] ABSTRACT

An electric utility demand limiting device and method for disconnecting and reconnecting a load, such as a residential customer load, from a utility company power system. The device may include a preset demand limit against which power consumption is compared when the device is remotely enabled in response to a remote control signal from the utility company. The demand limit may be variable.

26 Claims, 3 Drawing Figures

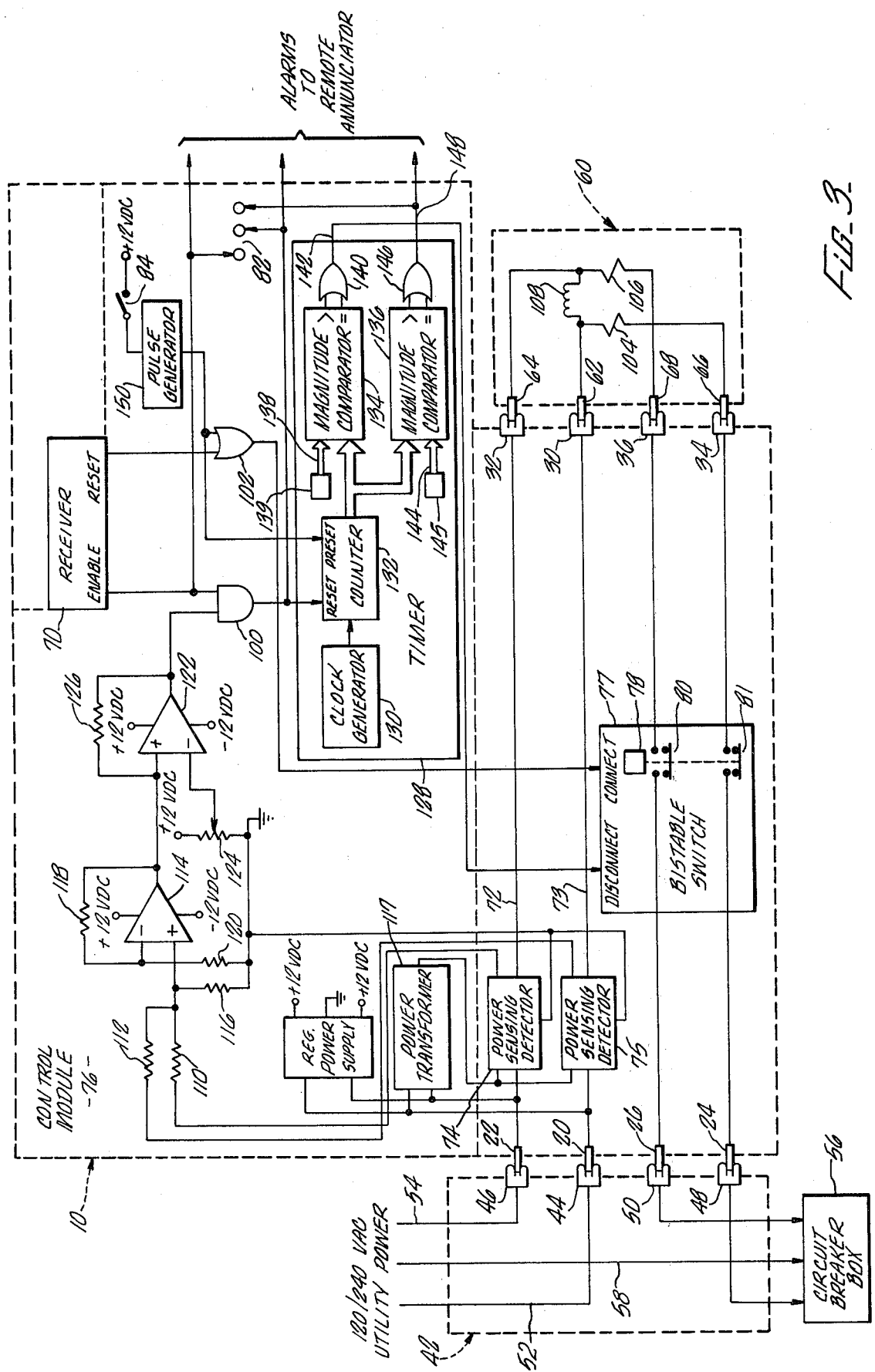

ELECTRIC UTILITY DEMAND LIMITING DEVICE AND METHOD

BACKGROUND OF THE INVENTION

The present invention relates generally to utility power conservation devices and more particularly to an electric utility demand limiting device and method for controllably connecting and disconnecting a utility customer from a utility power system.

As the cost and difficulty of providing additional electrical power generating capacity increases, electrical power utilities have sought ways to limit or decrease the peak electrical power demand that may occur throughout a typical operating day. By limiting or lowering this peak demand, additional generating capacity need not be added and the existing generating capacity may be more efficiently utilized.

Various devices, systems and methods have been proposed toward this end. For example, in order to vary the cost of electric power to a customer and to thus discourage power consumption when overall demand is high, U.S. Pat. No. 3,683,343 to Feldman, et al. describes a remotely controlled demand metering system. The meter, upon reception of suitably coded signals from a power station, records a number of kilowatt-hours greater than actually consumed. This metering system, however, only encourages voluntary conservation by the customer and thus does not effectively limit the customer's electrical power consumption to some preset limit.

As another incentive for reducing power consumption during peak demand periods, the utilities have instituted demand billing wherein the cost of electrical power varies with the customer's maximum demand during a predetermined time period. Various devices, systems and methods are known that can be used at the utility customer's site to monitor power consumption and to disconnect one or more loads to thus control the customer's peak power consumption. Such devices, systems and methods are described, for example, in U.S. Pat. Nos. 3,789,236, 4,075,699, 4,117,537, 4,125,782, 4,125,895, 4,153,936, 4,167,679 and 4,168,491. The patent to Lacroix, U.S. Pat. No. 3,789,236, also describes a device that can sound an alarm when power consumption reaches a preselected threshold.

These devices, however, do not respond to a remote control signal from a utility company. Thus, although there may actually be no necessity for limiting power demand, the devices will still function to disconnect loads or sound alarms, consequently resulting in greater customer inconvenience than is necessary. Also, these devices generally integrate power consumption with respect to time. If the customer's load includes devices or machines that have a high inrush current as occurs, for example, during the start of electric motors, this integration technique can cause the control device to disconnect loads prematurely.

Moreover, since these devices disconnect or connect specific loads in response to excessive power consumption, it is not possible for the customer to easily select the particular load that is desired to be disconnected at a particular time. This can result in inconvenience where, for example, the control device controls an air conditioning compressor but the customer instead desires to continue operation of the compressor and to instead disconnect some other load such as a swimming pool pump motor or an electric water heater. This leads not only to increased customer inconvenience but also can result in substantial customer dissatisfaction.

Further disadvantages of the control devices discussed in the above-referenced patents is that the devices are generally relatively complex and that it is often difficult to retrofit such a device at the customer's site because extensive wiring and modification of various of the customer's loads is required.

Yet other devices and systems are known which disconnect specific customer loads in response to a control signal generated at a remote point. Such devices and systems are generally described in U.S. Pat. Nos. 3,906,242, 4,023,043, 4,130,874, 4,135,181, 4,152,605 and 4,161,720. The systems can allow an electric utility to disconnect certain of the consumer's loads during peak power demand times so that the peak power demand can be reduced.

Such devices and systems, however, disconnect or shed selected customer loads regardless of the total power consumption by the individual customer. Although this can help to limit peak demand, some customers may still retain a relatively large power demand during this period. Also, as discussed above, these devices and systems do not allow an individual customer to select the particular load that the customer desires to do without during the peak demand period.

Also, several of the systems require relatively complex and expensive control centers and correspondingly complex and expensive devices at the customer's site. The individual customer loads to be disconnected must also be modified and connected to the control device. Although the control devices may disconnect specified loads, these control devices do not encourage overall utility customer conservation since the remaining customer load is unaffected. Furthermore, since only a portion of the customer's total load is controlled, it is more difficult for the utility company to accurately project the peak power demand that may occur at a given time.

SUMMARY OF THE INVENTION

A demand limiting device and method in accordance with the present invention overcomes the limitations and disadvantages described above. The device and method of the present invention are not limited to utility customer power limiting or shedding applications. For example, the present invention may be advantageously employed within an energy producing facility such as an integrated refinery or coal gassification plant which produces as well as consumes electrical energy to thereby adjust peak load conditions. However, the invention will be described in terms of a preferred embodiment suitable for use by an electrical utility. Other applications will be readily apparent to those skilled in the art.

One demand limiting device of the invention includes, in an exemplary embodiment, detectors which provide an output that is proportional to the power consumption of a utility customer. The output from the detectors is compared with a preset electrical power consumption limit and when the power consumption exceeds the preset limit and the device is enabled in response to a remote control signal from the power utility, a switch is operated to disconnect the customer from the utility power source. To restore service, the device includes resetting means to reconnect the customer to the utility power source to thereby restore the utility power to the customer. One or more alarms may be provided to the customer to indicate various operational states. The demand limiting device may be advantageously contained in a housing that includes an adaptor which may be quickly and easily installed between a conventional kilowatt-hour meter and an associated meter socket.

A method according to the present invention includes generating a signal that is representative of electrical power consumption at a utility customer site and comparing this signal with a preset electrical power consumption limit. When enabled by a remote control signal, the utility customer is disconnected from the utility power source when the electrical power consumption exceeds the consumption limit. However, the utility customer can be reconnected to the utility power source by reset means operated at the utility customer site or when the power demand limiting method is no longer enabled.

Thus, a device according to the present invention is easily installed and provides a power consumption comparison at the customer's site in response to a utility company remote control signal. Moreover, such a device continuously performs this comparison rather than summing or integrating power consumption over a time period so that large transient loads will not inadvertently and inconveniently cause the device to disconnect the customer from the utility power service. Because a demand limiting device according to the present invention may be installed for individual customers, each customer can allocate electrical power up to the preset limit during a peak demand period, thus increasing the freedom of choice available to the customer in the determination of the specific loads that will or will not be maintained. Furthermore, since the preset limit may be adjusted by the utility company, the utility company can then offer various preset limits to which individual customers may "subscribe" with, for example, lower preset limits resulting in lower electrical power costs and thereby encouraging electrical power conservation. This enhances the ability of the utility company to more accurately predict peak demand power levels. Also, the various alarms available to the customer allow the customer to adjust individual loads during peak demand periods so that the customer's electrical power service will not be interrupted. Similarly, a method practiced in accordance with the present invention provides comparable advantages.

It is thus an object of the present invention to provide an improved demand limiting device and method.

It is another object of the present invention to provide a demand limiting device that is easily installed at the customer's site and a method that is easily implemented.

It is a further object of the present invention to provide a demand limiting device and method wherein power demand is individually determined for each customer.

These and other advantages and objects of the present invention will become apparent from the following detailed description in conjunction with the drawings wherein:

FIG. 3 is a simplified schematic diagram of a demand limiting device according to the present invention.

Figure 1:
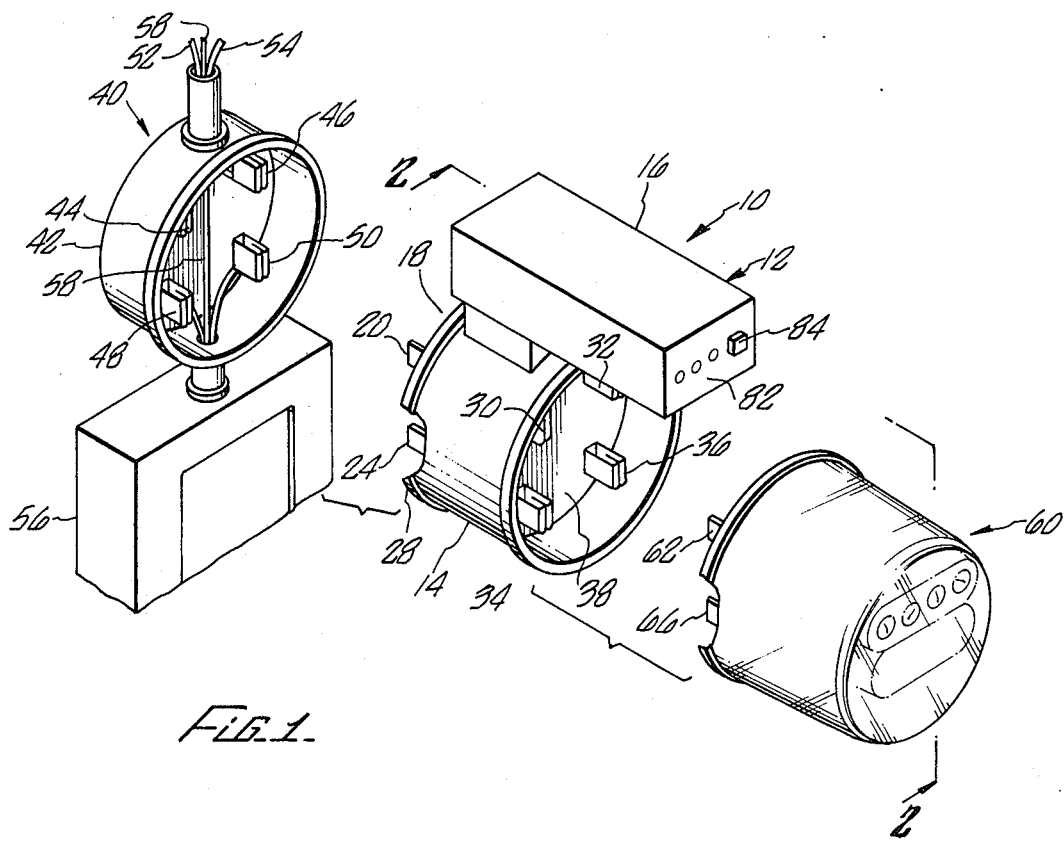
FIG. 1 is an exploded perspective view of an exemplary electrical power service entrance employing a device in accordance with the present invention.

A demand limiting device 10, as shown in FIG. 1 and as is described below, includes power detectors which provide an output that is proportional to the power delivered from a power source, such as an electric utility company, to a load which can be, for example, a residential utility customer. The device 10 further includes a receiver which, in response to a remote control signal from the utility company, enables the power demand limiting function performed by the device 10. When a comparator output indicates that the output from the detectors exceeds a preset electrical power consumption limit and when the receiver has enabled the device 10, a timer operates a switch after a predetermined time period to disconnect the load from the power source. Electrical power may be restored by operating reset means or when the device 10 is no longer enabled by the receiver. One or more alarms may be provided to indicate, for example, that the device has been enabled, that the power consumption exceeds the preset limit, or that the power consumption has exceeded the preset limit for a second predetermined length of time.

Figure 2:
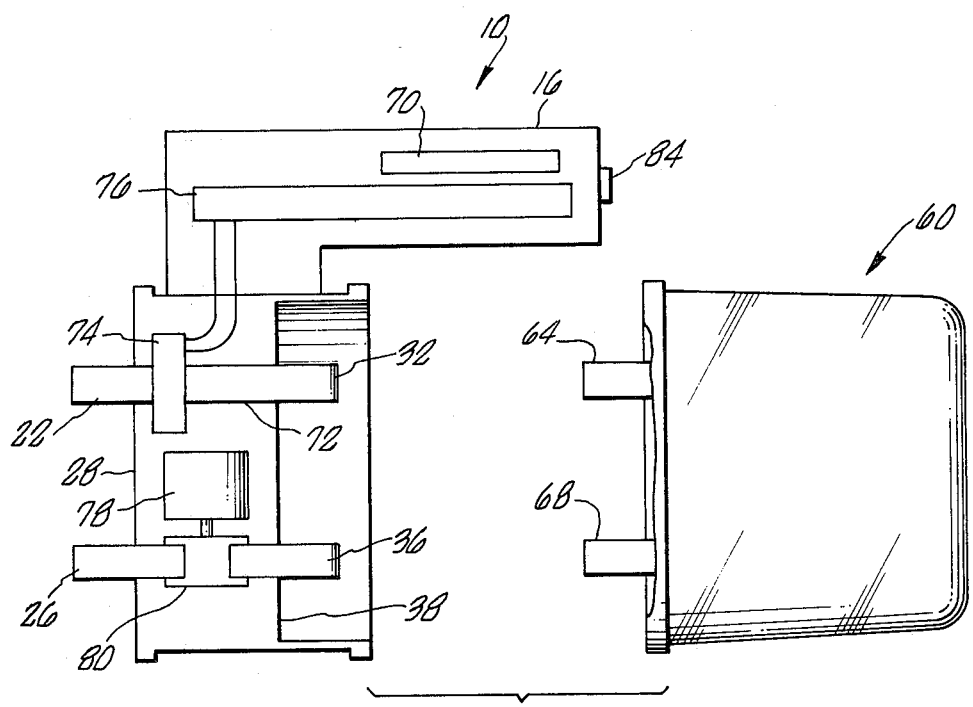
FIG. 2 is a simplified sectional view of the device and a kilowatt-hour meter taken substantially along the line 2—2 of FIG. 1.

With reference to FIG. 1, a demand limiting device 10 may be contained in a housing generally designated 12. The housing 12 includes a cylindrical horizontal meter extender or adaptor 14, a rectangular receiver and control module case 16 and a support column 18 extending between the adaptor 14 and the case 16. The adaptor 14 includes a plurality of connecting plugs 20–26 as seen in FIGS. 1 and 2 extending from a rear plug surface 28 of the adaptor 14. Similarly, a plurality of connecting jacks 30–36 extend from a front jack surface 38 of the adaptor 14.

With continued reference to FIG. 1, an electric utility service entrance 40 for, for example, a residential customer, generally includes a kilowatt-hour meter socket 42 that has a plurality of connecting jacks 44–50. Incoming 240 volt lines 52 and 54 are connected to the jacks 44 and 46, respectively. The lower jacks 48 and 50 are connected to the customer's circuit breaker box 56 to thus provide electrical power service to the customer. Conventionally, a common or return line 58 passes through the meter socket 42 to the circuit breaker box 56. A conventional kilowatt-hour meter 60 may be connected to the socket 42 by connecting a plurality of meter connecting plugs 62–68 to the corresponding socket connecting jacks 44–50. The meter 60 completes the circuit from the incoming utility lines 52 and 54 to the customer's circuit breaker box 56.

The connecting plugs 20–26 of the device 10 are disposed on the rear plug surface 28 in a configuration similar to the connecting plugs 62–68 of the meter 60. Similarly, the connecting jacks 30–36 are disposed on the front socket surface 38 in a configuration similar to the meter socket connecting jacks 44–50.

To install the demand limiting device 10 of the present invention, the meter 60 is removed from the meter socket 42. In its place, the device 10 is installed into the meter socket 42 so that the connecting plugs 20–26 are inserted into and thus connect to the corresponding connecting jacks 44–50. The meter 60 may then be installed on the front connector surface 38 of the device 10 to connect the meter connecting plugs 62–68 to the device connecting jacks 30–36. In this way, the device 10 is easily and quickly installed. Conversely, the device 10 can be quickly and easily removed by disconnecting the device 10 from the meter socket 42, disconnecting the meter 60 from the device 10 and reinstalling the meter 60 into the meter socket 42.

Turning now to FIG. 2, the demand limiting device 10 includes within the case 16 a suitable receiver 70 such as a Scientific Atlanta model DES-1090. The receiver 70, as is described below, is responsive to remote control signals from the utility company to enable the operation of the device 10. Within the adaptor 14, a conducting strap 72 connects the connecting plug 22 to the associated connecting jack 32. Disposed about the strap 72 is a power sensing detector 74. The detector 74 senses the power supplied to the customer via the strap 72 and provides a signal representative thereof to a control module 76 located within the case 16. Any suitable detector may be employed as the detector 74 such as, for example, a current transformer that generates an output proportional to current flowing through the strap 72. In the preferred embodiment of FIGS. 1-3, the detector 74 is a Hall effect watt sensor manufactured by F. W. Bell, model no. IB-5011M which advantageously provides an output that is directly proportional to power in watts delivered through the strap 72.

Also housed within the adaptor 14 is a bistable switch 77 that includes in part a control solenoid 78 which operates a single-pole double-break switch element 80. The switch element 80 connects or disconnects the connecting plug 26 with the associated connecting jack 36.

The connecting plugs 20 and 24 shown in FIG. 3 and the connecting jacks 30 and 34 are connected in a similar fashion as described above for the connecting plugs 22 and 26 and the connecting jacks 32 and 36. A conducting strap 73 connects the connecting plug 20 with the connecting jack 30 and a suitable power sensing detector 75 provides a signal proportional to the power delivered via the strap 73 to the control module 76. Also, a switch element 81 similar to the switch element 80 and controlled by the control solenoid 78 connects or disconnects the connecting plug 24 from the connecting jack 34.

With continued reference to FIGS. 2 and 3, once the device 10 is enabled by the receiver 70, the control module 76 compares the power delivered through the device 10 to the customer with a preset limit. If this limit is exceeded for a predetermined length of time, the control module 76 operates the control solenoid 78 to open the switch elements 80 and 81 to disconnect the customer from the utility power. The control module 76 may also provide alarm signals indicative of various operational states to suitable alarm indicators 82 on the case 16 or can provide alarm signals to one or more remote alarm annunciators. As is well known to those skilled in the art, a remote annunciator may be connected directly to the device 10 or the alarm signals from the device 10 may be encoded and transmitted through the connecting plugs 24 and 26 to a remotely located annunciator which decodes the signals to provide a suitable display.

When the device 10 is no longer enabled by the receiver 70, the control module 76 resets the control solenoid 78 to close the switch elements 80 and 81 to thus restore utility power to the customer. Alternatively, a suitable reset signal may be provided to the control module 76 via, for example, a reset switch 84 located on the case 16 to consequently restore utility power to the customer.

The housing 12 can be adapted for various meter installation configurations. Also, the receiver and control module case 16 can be eliminated by including the receiver 70, the control module 76, the alarm indicators 82, and the reset switch 84 within or upon the adaptor 14.

As shown in FIG. 3, the receiver 70 provides an enable signal to a first input of a disconnect control AND gate 100 in response to a control signal from the utility company. In a preferred embodiment, the receiver 70 is a UHF radio receiver which, in response to a control signal transmitted by a compatible transmitter, provides an enable output for a predetermined length of time such as 30 minutes. This length of time may be reset or refreshed by an additional control signal or signals before the predetermined length of time ends to thereby continuously enable the device 10, for example, during peak demand. However, if no resetting or refreshing control signal is received during the predetermined time period, the receiver 70 then removes the enable signal from the gate 100 and instead provides a reset signal to a reset control OR gate 102. Other types of receivers may be employed within the device 10 such as a radio receiver responsive to distinct enable and reset command signals or a receiver connected via telephone lines to a utility company control center. Moreover, one such receiver may be used to enable and reset several demand limiting devices.

The enable signal is also applied from the receiver 70 to one of the alarm indicators 82 and may also be provided by the device 10 to a remote alarm annunciator that may be disposed, for example, within the customer's home where the various operational conditions of the device 10 can be readily observed.

As seen now schematically in FIG. 3, when the device 10 is installed in the meter socket 42 and the meter 60 is installed on the device 10, the incoming line 52 is connected through the connecting jack 44, the connecting plug 20, the strap 73, the connecting jack 30 to the connecting plug 62 of the meter 60. The meter 60, in a conventional fashion, includes a current coil 104 between the connecting plugs 62 and 66. The connecting plug 66 is then connected through the connecting jack 34 to the switch element 81 of the bistable switch 77 and in turn to the connecting plug 24 and the connecting jack 48 to thereby connect the first leg of the 120/140 volt utility power to the circuit breaker box 56.

Similarly, the incoming 120 volt line 54 is connected through the device 10, through a second current coil 106 of the meter 60 and through the switching element 80 to thereby provide the second leg of the utility power to the circuit breaker box 56. Further in a conventional fashion, the meter 60 includes a potential coil 108 connected between the two legs of the utility power applied through the meter 60.

The power sensing detectors 74 and 75 provide output signals through respective resistors 110 and 112 to a non-inverting input of a summing amplifier 114. A resistor 116 is connected from the common connection point of the resistors 110 and 112 to a common bus within the device 10. The detectors 74 and 75 are excited by a transformer 117 powered from the straps 72 and 73 and the common or return terminals of the detectors 74 and 75 are also connected to the common bus within the device 10.

The amplifier 114 is connected in a conventional fashion to sum the signals from the detectors 74 and 75 and in an exemplary embodiment includes a feedback resistor 118 connected from the output of the amplifier 114 to the inverting input thereof. A resistor 120 is connected from the inverting input to the device common bus.

The output of the amplifier 114 is applied to the non-inverting input of a non-inverting comparator 122. A power consumption limit adjustment potentiometer 124 is connected between +12 volts dc and the device common bus and the adjustable wiper of the potentiometer 124 is applied to the inverting input of the comparator 122. The voltage threshold of the comparator 122 may be adjustably set to thereby adjust the preset electrical power consumption limit by adjusting the potentiometer 124 center arm. A resistor 126 is connected between the output and the non-inverting input of the comparator 122.

Thus, to this point, it is seen that the amplifier 114 and the comparator 122 sum the substantially instantaneous customer power consumption and compares this with an adjustable preset electrical power consumption limit. When this limit is exceeded, the output of the comparator 122 generates a high-level signal which is applied to a second input of the disconnect control AND gate 100.

The gate 100, in response to the enable signal from the receiver 70 and in response to the high-level output from the comparator 122, generates a high-level output signal which is applied to a timer 128. The output from the gate 100 is also applied to one of the alarm indicators 82 and may be applied to a suitable remote annunciator as described above.

The timer 128 includes a clock pulse generator 130 that provides clock pulses at a predetermined frequency to a counter 132. The counter 132 in response to a low-level signal from the gate 100 is reset or cleared to zero and, while the low-level signal is present, is held at zero. However, when the gate 100 provides a high-level signal in response to an enable signal from the receiver 70 and a high-level output from the comparator 122, the counter 132 counts the clock pulses from the generator 130 and provides, for example, a binary digital output to a first and a second digital magnitude comparator 134 and 136. Second digital inputs 138 are applied from a suitable source 139 to the magnitude comparator 134. The source 139 can be, for example, a multiple output switch that can be adjusted to provide various digital outputs or can be a number of connections to high-level or low-level signal sources as is well known to those skilled in the art. The second digital inputs 138 represent a digital number equal to an output from the counter 132 that occurs after the counter 132 counts a predetermined number of clock pulses to thus measure a predetermined time period. The magnitude comparator 134, when the output from the counter 132 is greater than or equal to the second digital inputs 138, generates output signals which are applied through an OR gate 140 via a line 142 to the bistable switch 77, the purpose of which is described below.

Similarly, third digital inputs 144 are applied to the magnitude comparator 136 from a suitable source 145 similar to the source 139 and these inputs 144 represent a digital number equal to an output from the counter 132 that occurs after a second predetermined period of time. The magnitude comparator 136 provides an output when the counter 132 output is equal to or greater than the third digital inputs 144 through an OR gate 146 via a line 148 to one of the alarm indicators 82 and to the remote annunciator.

The reset switch 84 is connected to +12 volts dc and, when operated, provides this power to a pulse generator 150 that in turn provides an output pulse to a second input of the gate 102 and to a preset input of the counter 132 within the timer 128. The pulse generator 150 generates, in an exemplary embodiment, an output pulse of approximately one second each time the reset switch 84 is operated and can include a monostable multivibrator.

The counter 132, in response to this preset signal, presets the output of the counter 132 to a count that is proportional to a length of time slightly less than the length of time represented by the second digital input 138 to the magnitude comparator 134. In an exemplary embodiment as in FIG. 3, the counter 132 may be preset to a count corresponding to approximately fifty-five seconds while the second digital inputs 138 and the third digital inputs 144 correspond to counts that are proportional to approximately sixty seconds and thirty seconds respectively. The time limits established by the magnitude comparators 134 and 136 and the preset count of the counter 132 can be adjusted according to the particular requirements of the demand device 10 desired. It is to be noted that when both the preset signal from the pulse generator 150 and the low-level reset signal from the gate 100 are applied to the counter 132, the preset signal takes precedence, thereby presetting the counter 132. When the preset signal is removed, the counter then functions as previously described.

The output on the line 142 from the timer 128 is applied to a disconnect input of the bistable switch 77. In response to this signal, the switch 77 operates the solenoid 78 to open the switch elements 80 and 81. This disconnects the circuit breaker box 56 from the utility power. The output from the reset control gate 102 is applied to a connect input of the bistable switch 77 and in response to this input, the switch 77 conversely operates the solenoid 78 to close the switch elements 80 and 81 and consequently to reconnect utility power to the circuit breaker box 56. In a preferred embodiment as in FIG. 3, the bistable switch 77 is ASCO Model No. 9132150, and once the switch elements 80 or 81 are either closed or opened, the bistable switch 77 does not require continuing signals from the timer 128 or the gate 102 or additional electric power to operate the solenoid 78. This contributes to the operational stability and relatively low quiescent power consumption of the device 10.

In operation, the receiver 70 of the device 10 provides a reset signal to the gate 102 when no enabling remote control signal has been received from the utility company. The gate 102 then provides an output to the connect input of the bistable switch 77 which causes the switch 77 to close the switch elements 80 and 81. Thus, when the device 10 is not enabled in response to a remote control signal from the utility company, the device 10 connects the utility power through the meter 60 to the circuit breaker box 56 as seen in FIGS. 1 and 3. It is to be understood that the reset signal from the receiver 70 is the complement of the enable signal, that is, that when the reset signal is high the enable signal is low and vice versa.

When the utility company determines that power demand limiting is desirable as would occur during peak demand periods, the utility company provides an enabling remote control signal to the receiver 70. The receiver 70 in response to this signal removes the reset signal from the gate 102 and provides the enable signal to the gate 100. The enable signal also is displayed via one of the alarm indicators 82 or by the remote annunciator, or both, to inform the customer that power demand limiting is in effect.

The signals from the power sensing detectors 74 and 75 which are proportional to the power delivered through the straps 72 and 73 to the customer are summed by the amplifier 114. The output from the amplifier 114 which is thus representative of the total instantaneous power being consumed by the customer is applied to the comparator 122. If this output is less than the preset electrical power consumption limit established by the potentiometer 124, then the comparator 122 provides a low-level signal to the gate 100. In response to this, the gate 100 generates a low-level signal that maintains the counter 132 and consequently timer 128 at reset. However, if the output from the amplifier 114 exceeds this preset limit, the comparator 122 then provides a high-level signal to the gate 100.

When the gate 100 receives the high-level signal from the comparator 122 and the enable signal from the receiver 70, the gate 100 generates an output high-level signal and the counter 132 consequently begins to count pulses from the pulse generator 130. The output from the gate 100 also lights one of the alarm indicators 82 and also provides a signal to the remote annunciator to notify the customer that the customer's power consumption has exceeded the preset limit. To prevent the device 10 from disconnecting the customer from the utility power, the customer can then turn off various of the customer's loads. If the customer's power consumption is reduced sufficiently so that the output from the summing amplifier 114 falls below the preset limit, the comparator 122 and the gate 100 provide a low-level output which removes the alarm signal and resets and holds the counter 132 at zero. In this instance, there has been no interruption in utility power to the customer and the device 10 continues to monitor the customer's power consumption.

However, if the customer's power consumption continues at a level exceeding the preset limit, the counter 132 continues to count the clock pulses and the magnitude comparator 136 provides an output via the line 148 after a period of approximately 30 seconds. This signal lights one of the alarm indicators 82 and is also provided to the remote annunciator to inform the customer that the preset limit has been exceeded continuously for at least thirty seconds. Consequently, the customer is notified not only that an excess load condition exists but that the condition has existed for at least thirty seconds and that the customer has no more than thirty seconds to reduce power consumption.

The customer may then reduce power consumption, resetting the counter 132 as described above. Again, the device 10 then continues to monitor the customer's power consumption.

Assuming, however, that the excess power consumption continues, the counter 132 continues to count clock pulses from the generator 130 until the magnitude comparator 134 provides an output via the line 142 approximately sixty seconds after the gate 100 applies the high-level signal to the counter 132. This signal on the line 142 causes the bistable switch 77 to disconnect the utility power from the circuit breaker box 56. In this way, the device 10 disconnects the circuit breaker box 56 from utility power when the customer's power consumption exceeds the preset limit continuously for the first predetermined time period.

With the device 10 still enabled by the receiver 70, the device 10 may be reset to restore utility power to the circuit breaker box 56. When the bistable switch 77 disconnects the utility power from the circuit breaker box 56 as described above, virtually no power is supplied through the straps 72 and 73 and thus the amplifier 114, the comparator 122 and the gate 100 operate to reset and hold the counter 132 at zero. The switch 84 can be operated by the customer to provide a preset pulse to the counter 132 and to provide a pulse through the gate 102 to the bistable switch 77. The bistable switch 77 closes the switch elements 80 and 81 to reconnect the utility power through the meter 60 to the circuit breaker box 56 and the pulse generator 150 presets the counter 132 to a count that is proportional to approximately fifty-five seconds.

If the customer's power consumption remains above the preset power consumption limit for approximately five seconds after the reset switch 84 is operated, the counter 132, the magnitude comparator 134 and the gate 140 again provide an output via the line 142 to open the switch elements 80 and 81 of the bistable switch 77 to thereby disconnect the circuit breaker box 56 from utility power. The five second delay established by presetting the counter 132 allows various initial loads such as the starting of motors and the high inrush current associated with electric heating elements to decrease. However, if the customer's power consumption becomes less than the preset limit before the counter 132 reaches a count proportional to sixty seconds, that is, before the five second delay ends, then the summing amplifier 114, the comparator 122 and the gate 100 function as described above to reset and hold the counter 132 at zero. The device 10 then continues to monitor the power delivered through the straps 72 and 73 as described above.

When the utility company no longer desires to continue power demand limiting, the receiver 70 in response to appropriate remote control signals removes the enable signal from the gate 100 and provides the reset signal through the gate 102 to the bistable switch 77. If the device 10 had disconnected the utility power from the customer during the power demand limiting period and if the device 10 had not been reset by the customer, then the reset signal from the receiver 70 operates the switch 77 to close the switch elements 80 and 81 to thereby restore utility power to the customer. The signal from the gate 100 also resets and holds the counter 132 at zero. Further operation of the device 10 is inhibited until the receiver 70 again enables the power demand limiting operation of the device 10.

Thus, the device 10 can be readily installed at the customer's site to provide remotely controlled and individually adjustable power demand limiting while allowing each utility customer flexibility in determining the particular loads that are to be operated during peak demand periods.

It will be recognized by those skilled in the art that the device 10 may be implemented with other suitable means. For example, a microprocessor or microcomputer may be employed along with suitable interface devices to digitally perform the summing, comparing, timing and gating functions described above for the summing amplifier 114, comparator 122, timer 128 and gates 110 and 102, respectively.

Having fully described one embodiment of the present invention, it is to be understood that numerous alternatives and equivalents which do not depart from the spirit of the present invention will be apparent to those skilled in the art given the teachings herein, and such alternatives and equivalents are intended to be included within the scope of the present invention.

What is claimed is:

1. An electrical power demand limiting device for controllably disconnecting a local load extraneous the device from a power source comprising signal generating means for generating a first signal representative of the electrical power consumption of the load, comparing means responsive to the signal generating means for comparing the first signal to a preset electrical power consumption limit, receiving means for receiving a remote control signal from a power production source responsive to conditions at said power production source for providing an enable output in response thereto to enable the operation of the device, disconnecting means responsive to the comparing means and to the enable output of the receiving means for disconnecting the said extraneous local load entirely from the power source when the first signal exceeds the preset limit and when the receiving means has enabled the device, and resetting means for resetting the disconnecting means to reconnect the local load to the power source such reconnected load being the entire initial load or a locally selected portion of said initial load.

2. An electrical power demand limiting device for controllably disconnecting a local load extraneous the device from a power source comprising signal generating means for generating a first signal representative of the electrical power consumption of the load, comparing means responsive to the signal generating means for comparing the first signal to a preset electrical power consumption limit, receiving means for receiving a remote control signal a power production source responsive to conditions at said power production source for providing an enable output in response thereto to enable the operation of the device, disconnecting means responsive to the comparing means and to the enable output of the receiving means for disconnecting the said extraneous local load entirely from the power source when the first signal exceeds the preset limit and when the receiving means has enabled the device wherein said disconnecting means further includes timing means for disconnecting the entire load from the power source after the first signal has exceeded the preset limit for a predetermined period, and resetting means for resetting the disconnecting means to reconnect the local load to the power source such reconnected load being the entire initial load or a locally selected portion of said initial load.

3. A device as in claim 2 wherein said timing means is further responsive to the enable output of the receiving means for disconnecting the entire load from the power source when the first signal has exceeded the preset limit and the enable output from the receiving means are concurrently present for said predetermined length of time.

4. A device as in claim 1 wherein said preset limit is adjustable.

5. An electrical power demand limiting device for controllably disconnecting a local load extraneous the device from a power source comprising signal generating means for generating a first signal representative of the electrical power consumption of the load, comparing means responsive to the signal generating means for comparing the first signal to a preset electrical power consumption limit, receiving means for receiving a remote control signal from a power production source responsive to conditions at said power production source for providing an enable output in response thereto to enable the operation of the device, said receiving means includes timing means for providing the enable output for a predetermined period of time in response to the remote control signal, disconnecting means responsive to the comparing means and to the enable output of the receiving means for disconnecting the said extraneous local load entirely from the power source when the first signal exceeds the preset limit and when the receiving means has enabled the device, and resetting means for resetting the disconnecting means to reconnect the local load to the power source such reconnected load being the entire initial load or a locally selected portion of said initial load.

6. A device as in claim 1 wherein said receiving means is further responsive to a second remote control signal for terminating said enable output.

7. A device as in claim 1 wherein said resetting means is operated manually or when the enable output is not present from said receiving means.

8. An electrical power demand limiting device for controllably disconnecting a local extraneous the device load from a power source comprising signal generating means for generating a first signal representative of the electrical power consumption of the load, comparing means responsive to the signal generating means for comparing the first signal to an adjustable preset electrical power consumption limit, receiving means for receiving a remote control signal from a power production source responsive to conditions at said power production source for providing an enable output in response thereto to enable the operation of the device, disconnecting means responsive to the signal generating means and to the receiving means for disconnecting the said extraneous local load entirely from the power source when the first signal exceeds the preset limit and the receiving means has enabled the device, said disconnecting means including timing means for disconnecting the entire load from the power source after the first signal has continuously exceeded the preset limit for a predetermined period of time, and resetting means for resetting the disconnecting means to reconnect the local load to the power source, said resetting means being operated manually or when the enable output is not present from the receiving means, and such reconnected load being the entire initial load or a locally selected portion of said portion of said initial load.

9. A device as in claim 8 further including alarm means for providing an alarm signal when the first signal exceeds the preset limit and said enable output is present.

10. A device as in claim 9 further including means for providing a second alarm signal when said first signal exceeds the preset limit for a second predetermined period of time, said second predetermined period of time being less than said first predetermined period of time.

11. A device as in claim 8 wherein said device further includes alarm means for providing an alarm when said enable output is present.

12. A device as in claim 8 wherein said disconnecting means includes bistable switch means including solenoid means for performing said disconnecting and reconnecting of the load and the power production source.

13. An electrical power demand limiting device adapted for installation at a utility customer site for controllably disconnecting the utility customer from a utility power service comprising signal generating means for generating a first signal representative of the electrical power consumption of the utility customer, comparing means responsive to the signal generating means for comparing the first signal to a preset electrical power consumption limit, said preset limit being adjustable by the utility company, receiving means for providing an enable output to enable the operation of the device and for terminating the enable output, at least said enable output being provided in response to a control signal from the utility company, disconnecting means responsive to the comparing means and to the receiving means for disconnecting the load from the utility power service when the first signal exceeds the preset limit and the enable output is present, said disconnecting means including timing means for delaying said disconnection until at least the first signal has exceeded the preset limit for a predetermined length of time, reset means operable at the utility customer site for generating a reset signal, means responsive to the reset signal and responsive to the receiving means for resetting the disconnecting means when either the reset signal is present or the enable output is not present to reconnect the utility customer to the utility power service to thereby restore the utility power service to the utility customer, and said device being housed in a housing having an adaptor including first connector means for plugging into a utility meter socket and second connector means for receiving a utility meter and said disconnecting means includes switch means for connecting or disconnecting said first connector means and said second connector means.

14. A device as in claim 13 wherein said switch means is a bistable switch.

15. A device as in claim 13 wherein said predetermined length of time is reset when the first signal is less than the preset limit.

16. A method for controllably limiting power demand from a power source by a local extraneous load including the steps of generating remotely a first signal at a power production source responsive to conditions at said power production source to enable the power demand limiting, generating a second signal representative of electrical power consumption by the load, comparing the electrical power consumption to a preset electrical power consumption limit, receiving the first signal from said power production source and providing an enable output in response thereto, disconnecting the said extraneous local load entirely from the power source when the electrical power consumption exceeds the consumption limit and the enable output is present, and reconnecting the local load to the power source in response to reset means or when the enable output is no longer present, such reconnected load being the entire initial load or a locally selected portion of said initial load.

17. A method for controllably limiting power demand from a power source by a local extraneous load including the steps of generating remotely a first signal at a power production source responsive to conditions at said power production source to enable the power demand limiting, generating a second signal representative of electrical power consumption by the load, comparing the electrical power consumption to a preset electrical power consumption limit, receiving the first signal from said power production source and providing an enable output in response thereto, disconnecting the said extraneous local load entirely from the power source when the electrical power consumption exceeds the consumption limit and the enable output is present, wherein the disconnecting step further includes delaying disconnecting the load from the power source until the electrical power consumption has exceeded the preset limit for a continuous predetermined time period, and reconnecting the local load to the power source in response to reset means or when the enable output is no longer present, such reconnected load being the entire initial load or a locally selected portion of said initial load.

18. A method as in claim 16 further including the step of providing an alarm when the electrical power consumption exceeds the preset limit.

19. A method for controllably limiting power demand from a utility power source at a utility customer site including the steps of generating a first signal remotely at said utility power source to enable the power demand limiting, generating a second signal representative of electrical power consumption at the utility customer site, comparing the electrical power consumption to an adjustable preset electrical power consumption limit, receiving the first signal from said utility power source and providing an enable output in response thereto, disconnecting the utility customer site from the utility power source when the electric power consumption exceeds the consumption limit and the enable output is present, said disconnecting being delayed until the electrical power consumption has exceeded the preset limit for a continuous predetermined time period, and reconnecting the utility customer site to the utility power source in response to reset means operated at the utility customer site or when the enable output is no longer present.

20. A method as in claim 19 wherein said disconnecting step further includes applying a third signal to a bistable switch means for disconnecting the utility customer site from the utility power source and applying a fourth signal to the bistable switch means for reconnecting the utility customer site to the utility power source.

21. A method for controllably limiting the power demand from a utility power source at a utility customer site including the steps of
generating a first signal remotely at said utility power source to enable the power demand limiting,
generating a second signal representative of electrical power consumption at the utility customer site,
comparing the electrical power consumption to an adjustable preset electrical power consumption limit,
receiving the first signal from said utility power source and providing an enable output in response thereto,
applying a third signal to bistable switch means to disconnect the utility customer site from the utility power source when the electrical power consumption exceeds the consumption limit and the enable output is present, said disconnecting being delayed until the electrical power consumption has continuously exceeded the preset limit for a predetermined time period, and
applying a fourth signal to the bistable switch means to reconnect the utility customer site to the utility power source in response to reset means operated at the utility customer site or when the enable output is no longer present.

22. An electrical power demand limiting device adapted for installation at a utility customer site for controllably limiting power demand from a utility power source comprising
signal generating means for generating a first signal representative of the electrical power consumption of the utility customer,
comparing means responsive to the signal generating means for comparing the first signal to a preset electrical power consumption limit, said preset limit being adjustable by the utility source,
receiving means for providing an enable output to enable the operation of the device and for terminating the enable output, at least said enable output being provided in response to a control signal from the utility source,
disconnecting means responsive to the comparing means and to the receiving means adapted for disconnecting load from the utility power source when the first signal exceeds the preset limit and the enable output is present, said disconnecting means including timing means for delaying said disconnection until at least the first signal has exceeded the preset limit for a predetermined length of time,
reset means operable at the utility customer site for generating a reset signal,
means responsive to the reset signal and responsive to the receiving means for resetting the disconnecting means when either the reset signal is present or the enable output is not present to reconnect the utility customer to the utility power source to thereby restore utility power to the utility customer, and
said device being housed in a housing having an adapter including first connector means for plugging into a utility meter socket and second connector means for receiving a utility meter.

23. An adapter as claimed in claim 22 wherein said disconnecting means is connected with switch means and is adapted to activate said switch means.

24. An adapter as claimed in either claim 22 or claim 23 wherein said housing includes a substantially cylindrical horizontal meter extender, and a substantially rectangular casing mounting on a support column between the extender and casing.

25. A method for controllably limiting power demand from a utility power source at a utility customer site including the steps of plugging into a meter utility socket an adapter for receiving a meter at the end remote from the socket,
generating a first signal representative of the electrical power consumption of the utility customer,
generating a second signal remotely from said power utility source to enable the power demand limiting,
comparing the first signal to a preset electrical power consumption limit, said preset limit being adjustable by the utility company,
receiving the second signal and providing an enable output in response to the second signal from the utility company,
disconnecting load from the utility power service when the first signal exceeds the preset limit and the enable output is present, said disconnecting being delayed until at least the first signal has exceeded the preset limit for a predetermined length of time,
generating a reset signal at the utility customer site, and
reconnecting load when either the reset signal is present or the enable output is not present thereby to reconnect the utility customer to the utility power source and restore utility power to the utility customer.

26. A method as claimed in claim 25 wherein disconnection includes applying a third signal to switch means for disconnecting the utility customer site from the utility power.

* * * * *